(12) United States Patent
Ardavan et al.

(10) Patent No.: US 10,756,580 B2
(45) Date of Patent: Aug. 25, 2020

(54) WIRELESS POWER TRANSFER SYSTEM

(71) Applicant: Oxford University Innovation Limited, Oxford (GB)

(72) Inventors: Arzhang Ardavan, Oxford (GB); James Semple, Oxford (GB)

(73) Assignee: Oxford University Innovation Limited, Oxford (GB)

( * ) Notice: Subject to any disclaimer, the term of this patent is extended or adjusted under 35 U.S.C. 154(b) by 12 days.

(21) Appl. No.: 16/304,394

(22) PCT Filed: May 25, 2017

(86) PCT No.: PCT/GB2017/051472
§ 371 (c)(1),
(2) Date: Nov. 26, 2018

(87) PCT Pub. No.: WO2017/203254
PCT Pub. Date: Nov. 30, 2017

(65) Prior Publication Data
US 2019/0296589 A1    Sep. 26, 2019

(30) Foreign Application Priority Data

May 25, 2016    (GB) .................................... 1609254.6

(51) Int. Cl.
*H02J 50/60*    (2016.01)
*H02J 50/10*    (2016.01)
(Continued)

(52) U.S. Cl.
CPC .............. *H02J 50/60* (2016.02); *B60L 53/12* (2019.02); *B60L 53/124* (2019.02); *B60L 53/60* (2019.02);
(Continued)

(58) Field of Classification Search
CPC . H02J 50/60; H02J 7/025; H02J 50/10; G01R 33/36; G01R 33/441;
(Continued)

(56) References Cited

U.S. PATENT DOCUMENTS 5,206,592 A * 4/1993 Buess ................. G01R 33/441
                                              324/307
5,233,300 A * 8/1993 Buess ...................... G01V 3/14
                                              324/300

(Continued)

FOREIGN PATENT DOCUMENTS

CN          104991207 A    10/2015
EP            1923724 A2    5/2008

OTHER PUBLICATIONS

International Search Report and Written Opinion dated Sep. 7, 2017 in connection with International Patent Application No. PCT/GB2017/051472, 12 pages.
Search Report dated Nov. 22, 2016 in connection with United Kingdom Patent Application No. 1609254.6, 4 pages.
Mallinson, "Wireless EV Charging made Safe with Foreign Object Detection and Living Object Protection Systems", WiseHarbor Spotlight Report, 2015, 6 pages.

*Primary Examiner* — Jared Fureman
*Assistant Examiner* — Michael J Warmflash
(74) *Attorney, Agent, or Firm* — Dorsey & Whitney LLP

(57) ABSTRACT

A wireless power transfer system (1) includes a primary coil (2) for generating an oscillating electromagnetic field for wirelessly transferring power to a secondary coil. The system also includes emitting coils (6) arranged to generate an electromagnetic field for exciting a nuclear quadrupole resonance in the biological material of an animal (7) exposed to the electromagnetic field generated by the emitting coils. The system also includes detecting coils (6) for detecting the absorption and/or emission of electromagnetic radiation by and/or from the excitation of the nuclear quadrupole resonance. The system is arranged, when the detecting coils detect the absorption or emission of electromagnetic radiation, to prevent the primary coil from generating, or to cause the primary coil to reduce the amplitude of, the oscillating electromagnetic field.

18 Claims, 2 Drawing Sheets

Figure 1:
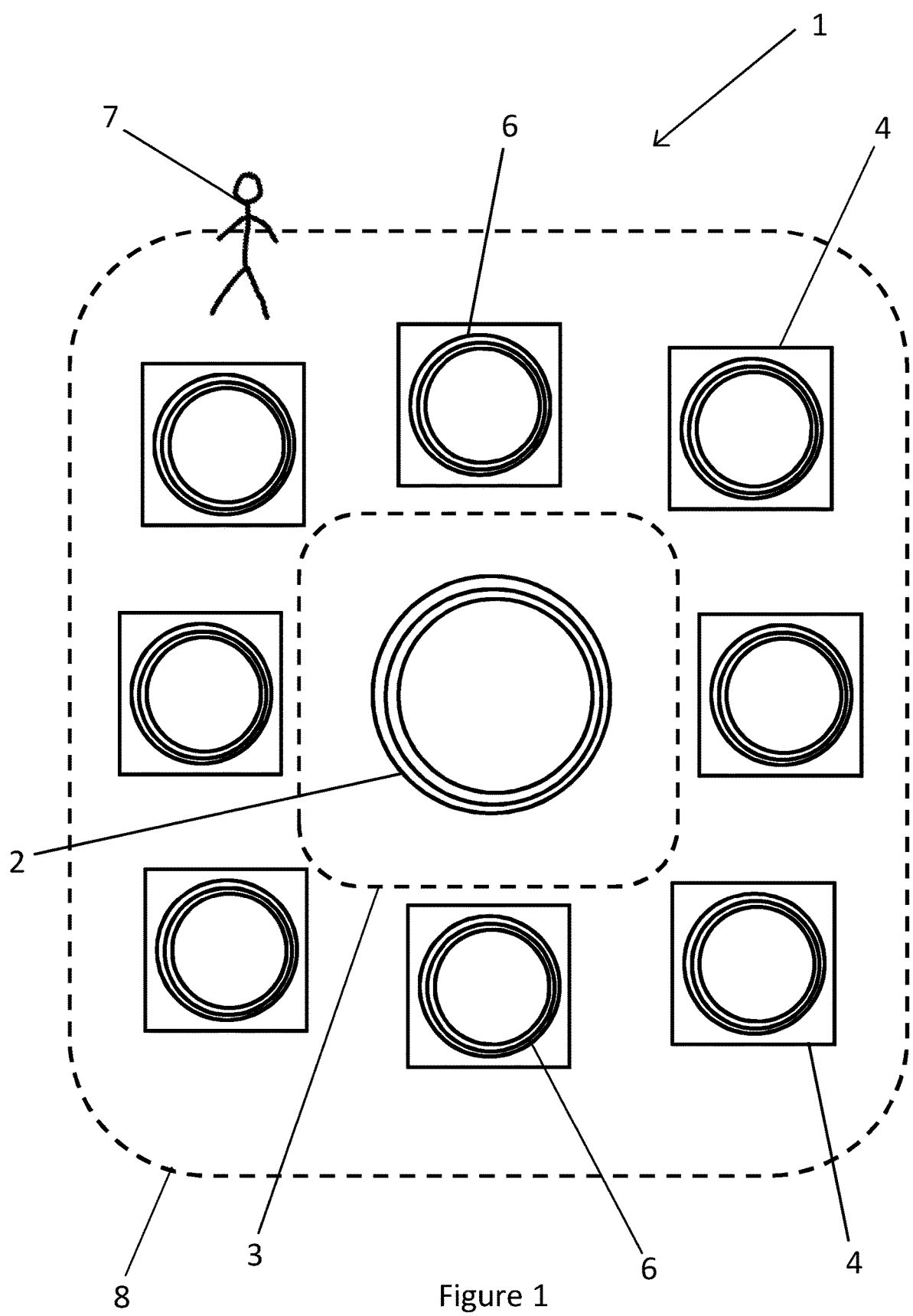

(51) Int. Cl.
*B60L 53/60* (2019.01)
*B60L 53/124* (2019.01)
*G01R 33/36* (2006.01)
*G01R 33/44* (2006.01)
*H02J 7/02* (2016.01)
*B60L 53/12* (2019.01)

(52) U.S. Cl.
CPC ......... *G01R 33/36* (2013.01); *G01R 33/3607* (2013.01); *G01R 33/441* (2013.01); *H02J 7/025* (2013.01); *H02J 50/10* (2016.02); *Y02T 10/7005* (2013.01); *Y02T 10/7072* (2013.01); *Y02T 90/122* (2013.01); *Y02T 90/14* (2013.01)

(58) Field of Classification Search
CPC ... G01R 33/3607; B60L 53/12; B60L 53/124; B60L 53/60; Y02T 90/122; Y02T 10/7005; Y02T 90/14; Y02T 10/7072
See application file for complete search history.

(56) References Cited

U.S. PATENT DOCUMENTS

| | | | |
|---|---|---|---|
| 7,106,058 B2* | 9/2006 | Wilker | G01R 33/441 324/300 |
| 7,595,638 B2* | 9/2009 | Crowley | G01V 3/101 324/300 |
| 2005/0104593 A1* | 5/2005 | Laubacher | G01R 33/34 324/322 |
| 2015/0260812 A1* | 9/2015 | Drake | G01R 33/441 324/307 |
| 2015/0280448 A1 | 10/2015 | White, II | |

* cited by examiner

WIRELESS POWER TRANSFER SYSTEM

This invention relates to a wireless power transfer system, in particular to such a system arranged to detect biological material.

Wireless charging systems for battery-operated electrically powered devices are becoming more prevalent, e.g. for electric and hybrid automotive vehicles. Such systems will generally have a primary coil or coils located in the ground that generates a magnetic field and a secondary coil or coils in the vehicle to be exposed to the magnetic field so to inductively recharge a battery in the vehicle. To recharge the battery in a timely manner, a relatively intense magnetic field may be required to be generated by the primary coil, e.g. delivering between 3.3 kW and 22 kW to the battery.

Such wireless charging systems offer a number of convenience benefits over conventional wired charging systems, e.g. cleanliness, ease of use, etc. However it will be appreciated that the high power magnetic fields used may present a safety hazard to humans and other animals that happen to pass close to the wireless charging system, owing to the non-ionising radiation from the magnetic field. Indeed, such systems may be required to adhere to safety regulations, e.g. those referring to the guidelines of the International Commission on Non-Ionising Radiation Protection (ICNIRP), so that they do not expose humans to harmful levels of non-ionising electromagnetic radiation.

It is therefore important for such wireless charging systems to incorporate measures to adhere with regulations to protect humans and, e.g., other animals from adverse exposure to the non-ionising radiation from the electromagnetic fields used. The present invention therefore aims to provide an improved wireless power transfer system.

When viewed from a first aspect the invention provides a wireless power transfer system comprising:

one or more primary coils for generating an oscillating electromagnetic field for wirelessly transferring power to one or more secondary coils;

one or more emitting coils arranged to generate an electromagnetic field for exciting a nuclear quadrupole resonance in the biological material of an animal exposed to the electromagnetic field generated by the one or more emitting coils; and one or more detecting coils for detecting the absorption and/or emission of electromagnetic radiation by and/or from the excitation of the nuclear quadrupole resonance;

wherein the system is arranged, when the one or more detecting coils detect the absorption and/or emission of electromagnetic radiation by and/or from the excitation of the nuclear quadrupole resonance in the biological material of an animal, to prevent the one or more primary coils from generating, or to cause the one or more primary coils to reduce the amplitude of, the oscillating electromagnetic field.

When viewed from a second aspect the invention provides a method of operating a wireless power transfer system, the wireless power transfer system comprising:

one or more primary coils for generating an oscillating electromagnetic field for wirelessly transferring power to one or more secondary coils;

one or more emitting coils for generating an electromagnetic field for exciting a nuclear quadrupole resonance in the biological material of an animal exposed to the electromagnetic field generated by the one or more emitting coils; and one or more detecting coils for detecting the absorption and/or emission of electromagnetic radiation by and/or from the excitation of the nuclear quadrupole resonance;

wherein the method comprises:

generating an electromagnetic field, using the one or more emitting coils, for exciting a nuclear quadrupole resonance in the biological material of an animal exposed to the electromagnetic field;

detecting the absorption and/or emission of electromagnetic radiation, using the one or more detecting coils, by and/or from the excitation of the nuclear quadrupole resonance; and preventing the one or more primary coils from generating, or causing the one or more primary coils to reduce the amplitude of, the oscillating electromagnetic field when the one or more detecting coils detect the absorption and/or emission of electromagnetic radiation by and/or from the excitation of the nuclear quadrupole resonance in the biological material of an animal.

The present invention provides a wireless power transfer system for transferring power wirelessly to one or more secondary coils, e.g. in an electrically powered device. The system includes one or more primary coils arranged to generate an oscillating electromagnetic field that is used to transfer power to the one or more secondary coils (thus preferably the method comprises generating an oscillating electromagnetic field, using the one or more primary coils, for wirelessly transferring power to one or more secondary coils, e.g. in an electrically powered device). The system also includes one or more emitting coils that are arranged to generate an electromagnetic field.

The electromagnetic field generated by the one or more emitting coils is arranged to excite a nuclear quadrupole resonance (NQR) in the biological material of any target animals that are exposed to the electromagnetic field generated by the one or more emitting coils. The electromagnetic radiation absorbed by the NQR in the biological material (i.e. the absorption of electromagnetic radiation from the electromagnetic field generated by the one or more emitting coils) and/or the electromagnetic radiation emitted by the NQR from the biological material (following the excitation of the NQR) is then detected by one or more detecting coils.

The system is arranged such that, when the one or more detecting coils detect that a NQR has been induced in the biological material of an animal that has been exposed to the electromagnetic field generated by the one or more emitting coils by detecting the absorption and/or emission of electromagnetic radiation by and/or from the excitation of the NQR, the one or more primary coils are prevented from generating the oscillating electromagnetic field (e.g. either by stopping the generation of the oscillating electromagnetic field or preventing it from (re)starting) or the one or more primary coils are caused to reduce the amplitude (and thus the power) of the oscillating electromagnetic field.

Thus it will be appreciated that the wireless power transfer system of the present invention, conveniently uses NQR to detect the presence of animals (through the detection of NQR excited in their biological material) that are exposed to the electromagnetic field generated by the one or more emitting coils, thus enabling the oscillating electromagnetic field to be prevented, stopped or reduced following the detection. This helps to prevent the animals from being exposed to the harmful non-ionising radiation from the oscillatory electromagnetic field generated by the one or more primary coils. (Unlike nuclear magnetic resonance (NMR), NQR does not require the application of an external, e.g. magnetic, field to induce the resonant transitions.)

The use of NQR to detect the biological material of animals is thus selective and specific to the target that is desired to be protected from the harmful non-ionising radiation from the oscillatory electromagnetic field generated by the one or more primary coils. The detection system is therefore less likely to give false positives, e.g. compared to a passive infrared (PIR) sensor or a radar detection system. The detection system may also provide a faster response, a better position resolution, better reliability and/or cost effectiveness compared to alternative putative detection systems, e.g. PIR, light detection and ranging (LIDAR), or radar.

The transfer of power from the one or more primary coils to the one or more secondary coils may be used for any suitable and desired purpose. In a preferred embodiment the one or more primary coils are arranged to generate an oscillating electromagnetic field for transferring power wirelessly to an electrically powered device, e.g. the electrically powered device comprises (or is connected to) one or more secondary coils. Thus, for example, the one or more primary coils are arranged to be connected to a, e.g. mains, power supply. Preferably the electrically powered device is charged by the power transferred wirelessly from the one or more primary coils, e.g. the electrically powered device comprises a battery connected (e.g. via power electronics) to the one or more secondary coils. It will also be appreciated that the transfer of power may be directly to a battery (e.g. removed from an electrically powered device), e.g. the battery comprises one or more secondary coils.

In another embodiment the one or more primary coils are arranged to generate an oscillating electromagnetic field for transferring power wirelessly from an electrically powered device or from a battery (e.g. in an electrically powered device), e.g. the electrically powered device comprises (or is connected to) the one or more primary coils. Thus, for example, the one or more secondary coils are arranged to be connected to a power storage system, e.g. a battery or a power distribution network (such as a local network, e.g. a home, or a larger network, e.g. a mains power grid network). This allows power, e.g. stored in or generated by an (e.g. battery of an) electrically powered device, to be transferred wirelessly from the electrically powered device or battery, e.g. to a remote power storage system.

It will also be appreciated that wireless power transfer system may be arranged to transfer power in either direction, e.g. to or from an electrically powered device or battery. In this embodiment the one or more primary coils and the one or more secondary coils are arranged to change their function, e.g. preferably the one or more primary coils and the one or more secondary coils are arranged to generate or receive an oscillating electromagnetic field. Thus preferably the one or more primary coils and the one or more secondary coils are each arranged to be prevented from generating, or to be caused to reduce the amplitude of, the oscillating electromagnetic field, when the one or more detecting coils detect the emission and/or absorption of electromagnetic radiation from and/or by the nuclear quadrupole resonance in the biological material of an animal.

The device (e.g. having a battery to be charged or discharged) to or from which power is transferred wirelessly may be any suitable and desired electrically powered device that is capable of having power transferred wirelessly to or from it, e.g. capable of being charged wirelessly. Thus, when the electrically powered device is having the power transferred to it wirelessly, preferably the electrically powered device comprises the one or more secondary coils arranged to have induced therein by the oscillatory electromagnetic field a current, e.g. for charging (e.g. the battery of) the electrically powered device. When the electrically powered device transfers powers wirelessly therefrom, preferably the electrically powered device comprises the one or more primary coils.

The electrically powered device may comprise one of any number of different types of electrically powered devices, e.g. an electric bus, an electric bike, an electric aircraft, an electric drone, a consumer electronic device, an electrically powered home appliance (e.g. computer equipment, a television, a display device, a tablet, a refrigerator, an electric power tool, a kitchen appliance). Preferably the electrically powered device is an automotive vehicle that is capable of being powered electrically, e.g. an electric or hybrid vehicle. Thus preferably the wireless power transfer system is configured to be suitable for transferring power to, e.g. charging, the automotive vehicle, e.g. it is arranged to charge the vehicle at a suitable power rating.

The one or more (preferably a plurality of) emitting coils may be arranged (to operate) in any suitable or desired way to generate an electromagnetic field for inducing nuclear quadrupole resonance in the biological material of an animal exposed to the generated electromagnetic field. In a preferred embodiment the one or more emitting coils are arranged to generate an oscillatory electromagnetic (preferably magnetic) field.

Preferably the electromagnetic (e.g. oscillatory magnetic) field generated by the one or more emitting coils (has a frequency that) is resonant with one or more NQR transitions in the biological material of an animal exposed to the generated electromagnetic field that it is desired to excite and detect (from the absorption and/or emission of electromagnetic radiation by and/or from the NQR in the biological material). Thus preferably the one or more emitting coils are arranged to generate the electromagnetic (e.g. oscillatory magnetic) field at a plurality of different frequencies (e.g. that are each resonant with one or more NQR transitions in the biological material). In some embodiments the frequencies may be selected to meet local, national or international regulations pertaining to frequency allocation.

In this way the electromagnetic field generated by the one or more emitting coils may be generated at a series of different (particular) frequencies that correspond to a particular "signature" of NQR transitions from biological material in animals, as is discussed below, i.e. only the frequency or frequencies of interest are generated. Alternatively the electromagnetic (e.g. oscillatory magnetic) field may be generated as a broadband source comprising a plurality of different frequencies, such that one or more NQR transitions that are present in the biological material are excited, as is also discussed below, i.e. a spectrum of different frequencies are generated but only those corresponding to the NQR transitions of interest are detected.

The frequency (or preferably the plurality of different frequencies) at which the electromagnetic field is generated by the one or more emitting coils may be any suitable and desired frequency, e.g., and preferably, depending on the NQR transitions that are desired to excite in the biological material. In a preferred embodiment the one or more emitting coils are arranged to generate an electromagnetic field having a frequency (or preferably a plurality of different frequencies) between 1 MHz and 100 MHz, e.g. between 1 MHz and 20 MHz, e.g. between 1 MHz and 5 MHz.

The one or more emitting coils may generate the electromagnetic (e.g. oscillatory magnetic) field in any suitable and desired way. In one embodiment the electromagnetic field comprises a continuous wave electromagnetic field. Preferably the continuous wave electromagnetic field is generated at a plurality of different frequencies. The continuous wave electromagnetic field may be generated at the plurality of different frequencies simultaneously or the continuous wave electromagnetic field may be generated at, e.g. swept through, each of the plurality of different frequencies in succession.

In another embodiment the electromagnetic field comprises a pulsed electromagnetic field, e.g. one or more (preferably a plurality of) pulses of electromagnetic radiation. Preferably the (e.g. plurality of) pulses of electromagnetic radiation are generated at a plurality of different frequencies. The pulses may be arranged in any suitable and desired way, e.g. as a plurality (e.g. train) of $\pi/2$ pulses.

In one embodiment the one or more emitting coils are arranged to generate both a continuous wave electromagnetic field and one or more (preferably a plurality of) pulses of electromagnetic radiation.

The one or more (preferably a plurality of) detecting coils may be arranged (to operate) in any suitable or desired way to detect the absorption and/or emission of electromagnetic radiation by and/or from the nuclear quadrupole resonance(s) that have been induced in the biological material of an animal exposed to the electromagnetic field generated by the one or more emitting coils.

In a preferred embodiment the one or more detecting coils comprise one or more induction coils. The one or more detecting (e.g. induction) coils may be arranged to detect the emission and/or absorption of electromagnetic radiation from and/or by the nuclear quadrupole resonance(s) in any suitable and desired way.

In a preferred embodiment, when the one or more emitting coils are arranged to generate a continuous wave electromagnetic field, the one or more detecting coils are arranged to detect the absorption of electromagnetic radiation by the nuclear quadrupole resonance(s). In this embodiment the one or more detecting (e.g. induction) coils preferably form a high Q-factor system, so the material in the coil is sensitive to changes in the (e.g. complex) impedance of the coil, which may be detected to detect the absorption of electromagnetic radiation by the nuclear quadrupole resonance(s). The Applicant has appreciated that when wishing to determine the presence of nitrogen-14, for example, even when there is a no applied magnetic field, the integer nuclear spin of this isotope may be able to be exploited to allow the absorption of a continuous wave electromagnetic field.

Thus in one embodiment the one or more detecting (e.g. induction) coils are arranged to detect a change in the (e.g. complex) impedance of the one or more detecting (e.g. induction) coils caused by the absorption of electromagnetic radiation during excitation of the nuclear quadrupole resonance(s). Thus preferably the one or more detecting coils are arranged to be driven with the (e.g. frequency or plurality of frequencies of the) electromagnetic radiation absorbed by the nuclear quadrupole resonance(s). This resonance or resonances generated induces a change in the (e.g. complex) impedance of the one or more detecting (e.g. induction) coils that may be detected, e.g. as a (sharp) peak.

In a preferred embodiment (e.g. when the one or more emitting coils are arranged to generate a continuous wave electromagnetic field) the wireless power transfer system is arranged to perform time or frequency domain reflectometry using the (e.g. signal (e.g. the change in the impedance) induced in the one or more detecting coils by the (e.g. frequency or plurality of frequencies of the)) electromagnetic radiation absorbed by the nuclear quadrupole resonance(s), e.g. to determine a characteristic NQR response.

In another preferred embodiment, when the one or more emitting coils are arranged to generated a pulsed electromagnetic field, the one or more detecting (e.g. induction) coils are arranged to detect the emission of electromagnetic radiation from the nuclear quadrupole resonance(s). In this embodiment the one or more detecting (e.g. induction) coils preferably form a (relatively) low Q-factor system, e.g. that provides an amount of resonance for amplification of the response but has a relatively large bandwidth that allows the pulses to be short. The one or more detecting (e.g. induction) coils preferably act as an inductive component, e.g. in a tank (or LC) circuit, such that the emission of electromagnetic radiation from the excitation of the nuclear quadrupole resonance(s) induces a current in the one or more detecting (e.g. induction) coils. Thus the NQR may be detected by detecting the current induced in the coils.

Thus, in one embodiment the one or more detecting (e.g. induction) coils are arranged to detect an induced current in the one or more detecting (e.g. induction) coils caused by the emission of electromagnetic radiation from the excitation of the nuclear quadrupole resonance(s). Thus preferably the one or more detecting coils are arranged to be driven with the (e.g. frequency or plurality of frequencies of the) electromagnetic radiation emitted from the nuclear quadrupole resonance(s). This resonance or resonances generated induces a current in the one or more detecting (e.g. induction) coils that may be detected, e.g. as a (sharp) peak.

The one or more emitting coils and the one or more detecting coils may be provided in the system as separate coils. However, the emitting and detecting coils may be provided as the same one or more coils, i.e. the same coils may be used for both emitting the electromagnetic field and for detecting the NQR response. Thus in a preferred embodiment the wireless power transfer system comprises one or more emitting and detecting coils arranged to generate an electromagnetic field for exciting a nuclear quadrupole resonance in the biological material of an animal exposed to the electromagnetic field and to detect the emission and/or absorption of electromagnetic radiation from and/or by the nuclear quadrupole resonance.

Preferably the one or more emitting and detecting coils comprise a tank (or LC) circuit. Thus preferably the tank circuit is arranged to measure the voltage applied across the one or more emitting and detecting coils (to generate the electromagnetic field) compared to the voltage detected (induced by the absorption and/or emission of electromagnetic radiation by and/or from the nuclear quadrupole resonance) across the one or more emitting and detecting coils.

The one or more detecting coils may be arranged to detect the absorption and/or emission of electromagnetic radiation by and/or from the nuclear quadrupole resonance(s) in any suitable and desired way, e.g. depending on the nature of the electromagnetic field generated by the one or more emitting coils.

In one embodiment the one or more detecting coils are arranged to detect the absorption and/or emission of any electromagnetic radiation by and/or from the nuclear quadrupole resonance. The response of the one or more detecting coils may then be analysed to determine if the (e.g. frequency of the) electromagnetic radiation detected (as having been absorbed and/or emitted) corresponds to an NQR response from biological material. In another embodiment the one or more detecting coils are arranged to detect (e.g. only) a particular frequency or plurality of frequencies of electromagnetic radiation emitted from and/or absorbed by the nuclear quadrupole resonance, e.g. by the one or more detecting coils being arranged to be resonant (e.g. only) with this frequency or plurality of frequencies.

For example, when the one or more emitting coils generate a continuous wave electromagnetic field, e.g. sweeping through a plurality of frequencies, the one or more detecting coils may be arranged to detect (e.g. be resonant with) a plurality of frequencies corresponding to the electromagnetic radiation absorbed by the NQR transitions in biological material. Alternatively, when the one or more emitting coils generate a pulse of electromagnetic radiation (e.g. comprising one or a plurality of different frequencies), the one or more detecting coils may be arranged to detect (e.g. be resonant with) one or a plurality of frequencies corresponding to NQR transitions in biological material. The frequency or frequencies of the electromagnetic radiation to be detected (through its emission and/or absorption) may be any suitable and desired frequency or frequencies. In one embodiment the electromagnetic radiation has a frequency or frequencies between 1 MHz and 100 MHz, e.g. between 1 MHz and 20 MHz, e.g. between 1 MHz and 5 MHz.

The biological material in the animals to be detected may comprise any suitable and desired type of biological material that may be detected using NQR, e.g. any compound or nuclei that may be present in biological material, e.g. chlorine which is relatively abundant in biological material. In a preferred embodiment the biological material comprises one or more amino acids. Preferably the one or more emitting coils are arranged to generate an electromagnetic field (e.g. having a frequency or plurality of frequencies) for exciting NQR transitions in nitrogen-14 in the biological material (e.g. in the amino acids). Nitrogen-14 is particularly suitable for using in NQR owing to its spin-1.

Similarly, the animals to be detected as having been exposed to the electromagnetic field generated by the one or more emitting coils may be any suitable and desired animals that are to be protected from the oscillating electromagnetic field generated by the one or more primary coils. In one embodiment the animals comprise humans and/or other mammals (e.g. cats, dogs, rabbits). For example the frequency or plurality of frequencies of the electromagnetic field generated by the one or more emitting coils may be chosen to be suitable for exciting NQR transitions solely in humans, solely in other animals (e.g. other mammals) or in both.

The one or more emitting coils and/or the one or more detecting coils (or the one or more emitting and detecting coils) may be arranged in the wireless power transfer system, e.g. with respect to the one or more primary coils and thus the oscillating electromagnetic field, in any suitable and desired way. In a preferred embodiment the one or more emitting coils and/or the one or more detecting coils (or the one or more emitting and detecting coils) are arranged to generate an electromagnetic field and to detect the NQR response respectively in a zone (e.g. volume), e.g. such that this excites and detects NQR transitions in biological material of an animal that enters or passes through this zone.

The zone may be defined in any suitable and desired way, e.g. by the arrangement of the one or more emitting coils and/or the one or more detecting coils (or the one or more emitting and detecting coils). In a preferred embodiment the zone surrounds (and preferably also includes the volume of) the wireless power transfer system (e.g. surrounding (and, e.g., covering) the one or more primary coils), e.g. over a volume that is greater than or equal to the volume over which the oscillating electromagnetic field generated by the one or more primary coils has an amplitude (and thus, e.g., intensity or power) that may exceed than a particular value, e.g. over which it is deemed to be harmful to animals, e.g. where field strengths may exceed those of the guidelines provided by the International Commission on Non-Ionising Radiation Protection (ICNIRP) ("ICNIRP Guidelines for Limiting Exposure to Time-Varying Electric and Magnetic Fields (1 Hz-100 kHz)", Health Physics 99(6):818-836, 2010). This arrangement means that when an animal trespasses into the zone, its biological material is detected and the oscillating electromagnetic field generated by the one or more primary coils is switched off or reduced to a safe intensity, before the animal receives a harmful level of exposure of non-ionising radiation from the oscillating electromagnetic field. The volume over which the oscillating electromagnetic field generated by the primary coil has an amplitude that is greater than a particular value may be determined using simulations and/or measurements.

The zone may be any suitable and desired size, e.g. depending on the volume over which a harmful level of non-ionising radiation from the oscillating electromagnetic field is present. Thus the one or more emitting coils and the one or more detecting coils (or the one or more emitting and detecting coils) are preferably provided to give a suitable and desired detecting capability and sensitivity for the biological material throughout the zone. This may be able to be provided with only a single emitting coil and a single detecting coil (or a single emitting and detecting coil). However, in a preferred embodiment the wireless power transfer system comprises an array of emitting coils and an array of detecting coils (or an array of emitting and detecting coils) surrounding, e.g. at the perimeter of, the one or more primary coils and/or the one or more secondary coils.

The absolute size of the zone may depend on the size of the one or more primary coils (and/or the one or more secondary coils) and the amplitude of the oscillating electromagnetic field generated by the one or more primary coils (i.e. and thus the volume over which the a harmful level of non-ionising radiation from the oscillating electromagnetic field is present), which may depend on the type (and thus, e.g., size) of the electrically powered device to which or from which the power is being transferred by the wireless power transfer system.

For example, when the electrically powered device is an electrically powered (electric or hybrid) vehicle, preferably the dimensions of the zone are between 1.5 m by 3 m by 1.5 m and 3 m by 5 m by 3 m (width, length, height respectively), e.g. approximately 2 m by 4 m by 2 m.

The size (volume) of the zone may be chosen such that it allows the electrically powered device, e.g. comprising the one or more primary or secondary coils, to be placed within a range of positions, e.g. to be misaligned by a particular tolerance such that the system is still compliant with the, e.g. ICNIRP, regulations (this may be determined by simulation), and the wireless power transfer system to operate, e.g. as described above, to transfer power from the one or more primary coils to the one or more secondary coils. Thus preferably the system is arranged to detect when the electrically powered device is within a tolerance zone and to energise the one or more primary coils to generate the oscillating electromagnetic field (when the system has detected that the electrically powered device is within the tolerance zone). Preferably before the one or more primary coils are energised, the system determines that there is no target biological material, e.g. within the zone, being detected.

Thus the size of the zone (within which biological material is to be detected) may depend on the size of the tolerance zone and the amplitude of the oscillating electromagnetic field when the electrically powered device is placed at different positions within the tolerance zone and the one or more primary coils are generating the oscillating electromagnetic field (this may be determined, e.g. iteratively, by simulation).

In a preferred embodiment (particularly when the electrically powered device is an electrically powered (electric or hybrid) vehicle) the one or more primary coils, the one or more (e.g. array of) emitting coils and/or the one or more (e.g. array of) detecting coils (or the one or more (e.g. array of) emitting and detecting coils) are arranged on, in or under a floor (e.g. the ground). Thus preferably the electrically powered device is placed (e.g. the electrically powered (electric or hybrid) vehicle is driven) over the one or more primary coils, the one or more (e.g. array of) emitting coils and/or the one or more (e.g. array of) detecting coils (or the one or more (e.g. array of) emitting and detecting coils) to transfer power to the electrically powered device.

In a preferred embodiment the system comprises one or more (e.g. an array of) (e.g. floor) tiles comprising the one or more (e.g. array of) emitting coils and/or the one or more (e.g. array of) detecting coils (or the one or more (e.g. array of) emitting and detecting coils). This allows the, e.g. array of, emitting and/or detecting coils to be provided over an area, e.g. surrounding the one or more primary coils, so that the zone within biological material in an animal is to be detected can be defined. The one or more tiles may be arranged on, in (e.g. embedded) or under (e.g. buried) a floor (e.g. the ground)

In another embodiment one or both of the one or more (e.g. array of) emitting coils and/or the one or more (e.g. array of) detecting coils (or the one or more (e.g. array of) emitting and detecting coils) are arranged on or inside the electrically powered device to or from which the power is to be transferred wirelessly. This may be either when the one or more primary coils or the one or more secondary coils are located on or in the electrically powered device.

When the system comprises an array of emitting coils and/or an array of detecting coils (or an array of emitting and detecting coils), the system may use position information determined from the detection of the emission and/or absorption of electromagnetic radiation from and/or by the NQR by a plurality of detecting coils in the array, e.g. perform tracking of the emission and/or absorption of electromagnetic radiation from and/or by the NQR transitions, to filter the types of events detected. This may allow false positives to be screened out, e.g. such that only events that have a characteristic set of position information (e.g. a characteristic track) are used to prevent the one or more primary coils from generating, or to cause the one or more primary coils to reduce the amplitude of, the oscillating electromagnetic field. Thus preferably the method comprises (and the system is arranged to) determining, using the array of detecting coils (or the array of emitting and detecting coils), position information from the electromagnetic radiation detected by the array of detecting coils, determining, using the determined position information, when the position information exhibits a particular characteristic (e.g. consistent with NQR electromagnetic radiation emitted from and/or absorbed by the biological material of an (e.g. moving) animal), and preventing the one or more primary coils from generating, or causing the one or more primary coils to reduce the amplitude of, the oscillating electromagnetic field when it is determined that the position information exhibits the particular characteristic.

Once the one or more detecting coils have detected the absorption and/or emission of electromagnetic radiation by and/or from the nuclear quadrupole resonance from the biological material of an animal, the one or more primary coils may be prevented from generating, or caused to reduce the amplitude of, the oscillating electromagnetic field in any suitable and desired way. In a preferred embodiment the system is arranged to remove or reduce the power supplied to the one or more primary coils.

When the system is arranged to cause the one or more primary coils to reduce the amplitude of the oscillating electromagnetic field, e.g. by reducing the power supplied to the one or more primary coils, preferably the amplitude of the oscillating electromagnetic field is reduced to a particular amplitude such that the non-ionising radiation of the oscillating electromagnetic field is reduced to a level that is deemed not to be harmful to animals, e.g. consistent with the guidelines provided by the International Commission on Non-Ionising Radiation Protection (ICNIRP).

In a preferred embodiment the system is arranged to cause the one or more primary coils to restore the oscillating electromagnetic field (e.g. by restoring or increasing the power supplied to the one or more primary coils), e.g. when it is determined that the animal is clear of the zone. Thus preferably the one or more detection coils are arranged to detect when there is no longer electromagnetic radiation being emitted from and/or absorbed by the biological material of an animal, i.e. owing to there no longer being NQR being excited in the biological material. Preferably the system is able to control the power supplied to the one or more emitting coils and the one or more detection coils separately from the power supplied to the one or more primary coils, such that even when the power is removed from the one or more primary coils, the emitting and detection coils are still able to receive power.

In a preferred embodiment the wireless power transfer system comprises a control system arranged to prevent the one or more primary coils from generating or to cause the one or more primary coils to reduce the amplitude of the oscillating electromagnetic field when the one or more detecting coils detect the absorption and/or emission of electromagnetic radiation by and/or from the nuclear quadrupole resonance excited in the biological material of an animal. Thus preferably the control system is arranged to receive a control (e.g. voltage) signal from the one or more detecting coils (when the one or more detecting coils detect the absorption and/or emission of electromagnetic radiation by and/or from the nuclear quadrupole resonance in the biological material of an animal), e.g. that triggers the control system to prevent the one or more primary coils from generating, or to cause the one or more primary coils to reduce the amplitude of, the oscillating electromagnetic field.

The control system, when provided, is also preferably arranged to perform any suitable and desired analysis required by the wireless power transfer system, e.g. to control the (e.g. change in) frequencies at which the one or more emitting coils generates the electromagnetic field, to determine when a characteristic NQR response (e.g. "signature" of frequencies) corresponding to electromagnetic radiation emitted from and/or absorbed by NQR transitions in biological material has been detected by the one or more detecting coils (e.g. to perform the time or frequency domain reflectometry), and/or to determine the position information from the electromagnetic radiation detected by the, e.g. array of, detecting coils.

The control system may also be used to determine when an electrically powered device is placed within the tolerance zone, e.g. such that it is safe to energise the one or more primary coils to begin to transfer power wirelessly between the one or more primary and secondary coils.

The one or more emitting coils and the one or more detecting coils (or the one or more emitting and detecting coils) are preferably also arranged to detect conductive (e.g. ferrous) material, e.g. that is present in the zone (such material, e.g. a tool, may become heated to a dangerously harmful temperature by the oscillating electromagnetic field generated by the one or more primary coils). Thus preferably the one or more emitting coils and the one or more detecting coils (or the one or more emitting and detecting coils) are arranged to detect both biological and conductive (e.g. ferrous) material.

The wireless power transfer system may be arranged to detect the presence of conductive (e.g. ferrous) material in any suitable and desired way. Preferably the wireless power transfer system, e.g. the control system thereof, is arranged to detect a broadband dissipative response (i.e. a real response to the impedance of the one or more detecting coils). The response of the one or more detecting coils to the presence of conductive material is such that it affects the Q-factor of the one or more detecting coils. However this response is not frequency specific; it is a broad depression of the Q-factor of the one or more detecting coils at substantially all frequencies (at which the one or more emitting coils generate electromagnetic radiation). This is a (clearly) different response in the one or more detecting coils from the NQR and so the response is easily distinguishable therefrom (for the, e.g. common, control system).

It will be appreciated that the system and method of detecting the presence of animals via the NQR response from their biological material is not necessarily restricted to wireless power transfer systems, but may be applicable for any suitable and desired type of system in which animals are to be detected.

Thus when viewed from a further broad aspect the invention provides a system for detecting the presence of an animal comprising:

one or more emitting coils arranged to generate an electromagnetic field for exciting a nuclear quadrupole resonance in the biological material of an animal exposed to the electromagnetic field generated by the one or more emitting coils; and one or more detecting coils for detecting the absorption and/or emission of electromagnetic radiation by and/or from the excitation of the nuclear quadrupole resonance;

wherein the system is arranged, when the one or more detecting coils detect the absorption and/or emission of electromagnetic radiation by and/or from the excitation of the nuclear quadrupole resonance in the biological material of an animal, to generate a signal.

When viewed from another aspect the invention provides a method of detecting the presence of an animal comprising:

generating an electromagnetic field, using one or more emitting coils, for exciting a nuclear quadrupole resonance in the biological material of an animal exposed to the electromagnetic field generated by the one or more emitting coils;

detecting the absorption and/or emission of electromagnetic radiation, using one or more detecting coils, by and/or from the excitation of the nuclear quadrupole resonance; and generating a signal when the one or more detecting coils detect the absorption and/or emission of electromagnetic radiation by and/or from the excitation of the nuclear quadrupole resonance in the biological material of an animal.

It will also be appreciated by those skilled in the art that all of the described aspects and embodiments of the present invention can, and preferably do, include, as appropriate, any one or more or all of the preferred and optional features described herein. For example, the signal generated by the system for detecting the presence of an animal may be used in any suitable and desired way, e.g. to trigger another component to operate in a particular way. This may be to record a time-stamp, sound an alarm or otherwise create a signal.

Figure 2:
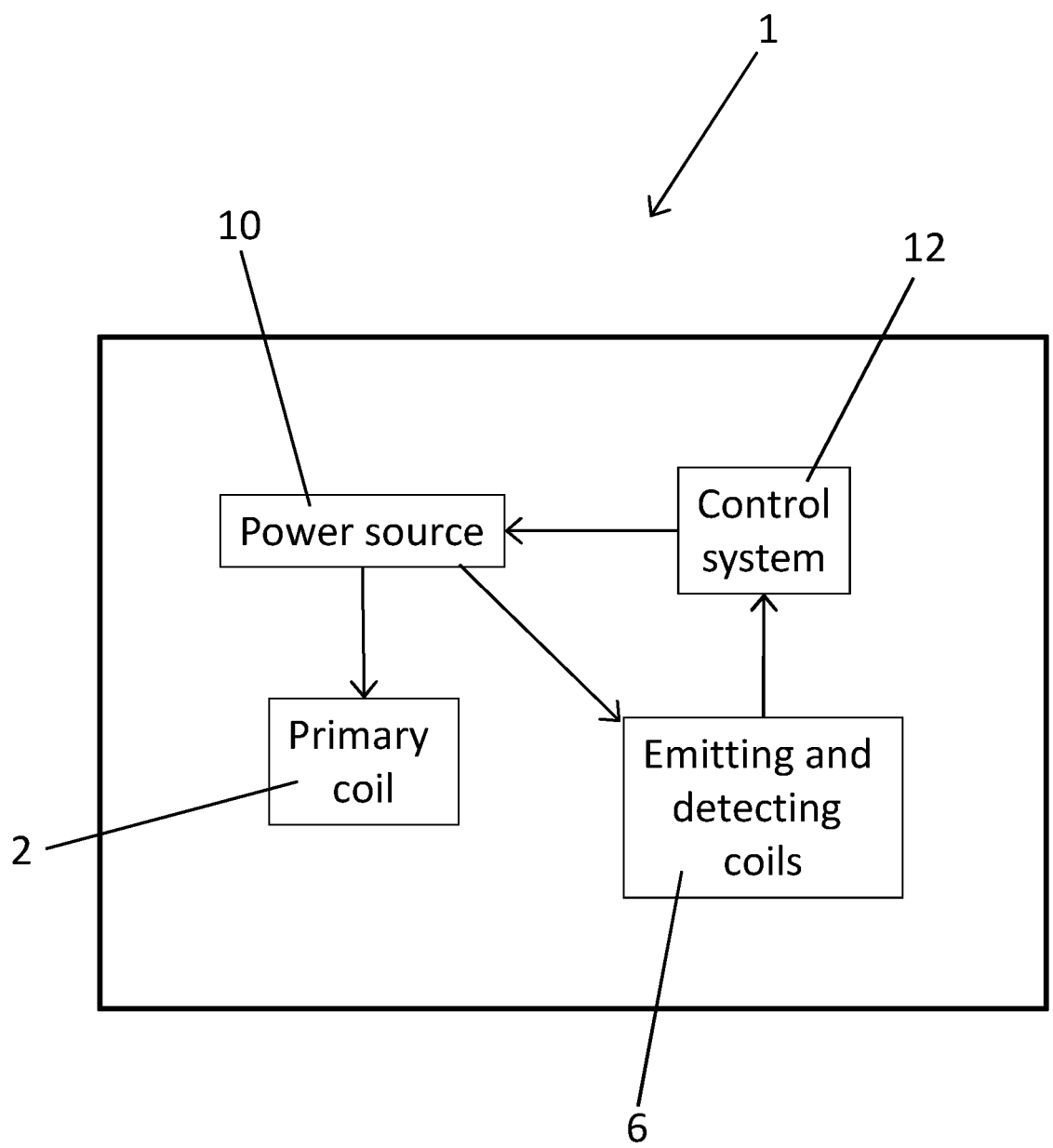

A preferred embodiment of the invention will now be described, by way of example only, with reference to the accompanying drawings in which:

FIGS. 1 and 2 show schematic diagrams of a wireless power transfer system in accordance with an embodiment of the present invention.

Wireless power transfer systems for electrically powered devices, e.g. electric and hybrid automotive vehicles, are becoming more prevalent. Owing to the relatively intense, e.g. magnetic, oscillating field that may be required to be generated by the one or more primary coils, e.g. between 3.3 kW and 22 kW, the non-ionising radiation of this field may present a safety hazard to humans and other animals that happen to pass close to the wireless power transfer system. It is therefore important for such wireless power transfer systems to incorporate safety measures to protect humans and, e.g., other animals from exposure to the non-ionising radiation from the electromagnetic fields used.

FIG. 1 shows a schematic diagram of a wireless power transfer system 1 in accordance with an embodiment of the present invention. The system 1 includes a primary coil 2 configured to generate an oscillating magnetic field (e.g. at a frequency of 85 kHz) that will induce a current (that can be used to charge a battery) in a secondary coil in an electrically powered device that is placed adjacent the primary coil 2. When the primary and secondary coils are appropriately aligned, such that the oscillating magnetic field generated by the primary coil 2 may be used to transmit power to the electrically powered device via the secondary coil, simulations have shown that the levels of electromagnetic radiation produced outside of an inner zone 3 that surrounds the primary coil 2 are consistent with the ICNIRP guidelines. However, the oscillating electromagnetic fields may have an intensity that is harmful to humans and other animals, e.g. exceeding guidelines provided by the ICNIRP, within the inner zone 3 that surrounds the primary coil 2.

The system 1 also includes an array of tiles 4 that surround the primary coil 2. The tiles 4 each contain an (emitting and detecting) induction coil 6 arranged to generate an oscillating magnetic field (in a continuous wave mode and/or a pulsed mode). The oscillating magnetic field is generated by the induction coils 6 at multiple frequencies between 1 MHz and 100 MHz for inducing nuclear quadrupole resonance in nitrogen-14 contained in the amino acids of a human 7 or other animal that is within (e.g. enters or passes through) an outer zone 8 that surrounds the array of tiles 4 (and thus also surrounds the inner zone 3 in which there is a harmful level of the oscillating magnetic field generated by the primary coil 1 when the wireless power transfer system 1 is in operation). (For the purposes of clarity, the array of tiles 4 is shown as surrounding the primary coil 2; however the array of tiles 4 may cover the entire surface, e.g. including the area of the primary coil 2.) The frequencies at which the oscillating magnetic field is generated by the induction coils 6 are chosen to correspond to nuclear quadrupole resonances in nitrogen-14 such as those that would indicate the presence of target amino acids.

The induction coils 6 are also arranged to detect, and be resonant with, the emission of electromagnetic radiation from the nuclear quadrupole resonance, excited by a pulse of the oscillating magnetic field emitted from the induction coils 6 and/or the absorption of electromagnetic by the nuclear quadrupole resonance excited by a continuous wave oscillating magnetic field emitted from the induction coils 6, in any humans 7 and other animals that are within the outer zone 8.

When the nuclear quadrupole resonance excited by a pulse of the oscillating magnetic field is desired to be detected, this is done by detecting a current that is induced by the emission of electromagnetic radiation from the nuclear quadrupole resonance that is incident upon the induction coils 6. When the nuclear quadrupole resonance excited by the continuous wave oscillating magnetic field is desired to be detected, this is done by detecting a change in the complex impedance of the induction coils 6 when the continuous wave oscillating magnetic field is absorbed by the nuclear quadrupole resonance.

FIG. 2 shows an additional schematic diagram of the wireless power transfer system 1 shown in FIG. 1. As shown in FIG. 2, the system 1 also includes a power source 10 that supplies power to the primary coil 2 and to the emitting and detecting (induction) coils 6, and a control system 12 that is connected to the power source 10 and the emitting and detecting (induction) coils 6. The control system 12 is configured to receive signals from the induction coils 6 and to send control signals to the power source 10 to control its operation.

Operation of the wireless power transfer system 1 shown in FIGS. 1 and 2 will now be described.

When an electrically powered device, e.g. an electric vehicle, is desired to have its battery charged, the device is placed (e.g. the vehicle is driven or guided) adjacent (over) the primary coil 2, e.g. within an area of misalignment. The control system 12 (e.g. through an operator switching the system 1 on or detecting that the device has been placed within the correct area) controls the power source 10 to supply power to the primary coil 2. The primary coil 2 generates a high power oscillating magnetic field that induces a current in a secondary coil in the device that is used to charge the battery.

The power source 10 also supplies power to the induction coils 6. In one mode of operation, the emitting induction coils 6 generate an oscillating magnetic field (in a continuous wave mode and/or a pulsed mode) at multiple frequencies between 1 MHz and 100 MHz that correspond to nuclear quadrupole resonances in nitrogen-14 such as that may be present in the target animals to be detected.

During operation of the system 1, i.e. when the induction coils 6 are generating an oscillating magnetic field, when a human 7 or other animal enters the outer zone 8 surrounding the array of tiles 4, the oscillating magnetic field generated by the induction coils 6 excites nuclear quadrupole resonances in the nitrogen-14 in the amino acids within the human 7 or other animal. When the nuclear quadrupole resonances are excited by a pulse of the oscillating magnetic field, the nuclear quadrupole resonance transitions emit electromagnetic radiation at multiple different frequencies.

The electromagnetic radiation emitted by the nuclear quadrupole resonance transitions is then incident upon the induction coils 6 and is resonant with the induction coils 6. A current is thus induced in the induction coils 6, which is measured by the control system 12. The control system determines if the induced current response is characteristic of nuclear quadrupole resonance transitions (e.g. in nitrogen-14 from amino acids) in the target human 7 or animals to be detected.

When the nuclear quadrupole resonances are excited by the continuous wave oscillating magnetic field, the nuclear quadrupole resonance transitions absorb the continuous wave electromagnetic radiation at multiple different frequencies.

The continuous wave electromagnetic radiation absorbed by the nuclear quadrupole resonance transitions causes a change in the impedance of the induction coils 6. This change of the induction coils 6 is measured by the control system 12. The control system 12 performs time or frequency domain reflectometry on these received signals (e.g. compared to the frequencies generated by the induction coils 6) to determine if the response is characteristic of nuclear quadrupole resonance transitions (e.g. in nitrogen-14 from amino acids) in the target human 7 or animals to be detected.

The control system 12 can also determine which induction coils 6 detected the electromagnetic radiation absorbed by or emitted from the nuclear quadrupole resonance transitions, and the strength of the response in each of these coils. This information is used by the control system 12 to perform pattern recognition to determine if the, e.g., path travelled by the human 7 or other animal is consistent with the movement of a human 7 or other animal, in order to dismiss any false positive signals.

When the control system 12 determines that the response is characteristic of nuclear quadrupole resonance transitions in nitrogen-14 from a human 7 or other animal, the control system 12 sends control signals to the power source 10 to prevent or remove power being supplied to the primary coil 2. Thus the primary coil 2 stops generating the high power oscillating magnetic field before the human 7 or other animal is able to reach the inner zone 3 in which the intensity of the non-ionising radiation from the high power oscillating magnetic field may exceed the guidelines provided by ICNIRP or otherwise be deemed to be potentially harmful.

Although the power is removed from the primary coil 2, the power source continues to supply power to the induction coils 6. The induction coils 6 therefore continue to excite nuclear quadrupole resonances in the nitrogen-14 in the amino acids within the human 7 or other animal and the resultant electromagnetic radiation emitted from or absorbed by the nuclear quadrupole resonance transitions is continued to be detected by the induction coils 6 and the control system 12. When the control system 12 determines that electromagnetic radiation emitted from or absorbed by the nuclear quadrupole resonance transitions is no longer being detected by the induction coils 6 (and thus the human 7 or other animal has moved outside the outer zone 8), the control system 12 sends control signals to the power source 10 to restore power to the primary coil 2, so that it may again generate the high power oscillating magnetic field to charge the battery in the electrically powered device.

At the same time as detecting the presence of animals in the inner or the outer zones 3, 7, the system 1 is also arranged to detect the presence of ferrous material in the inner and the outer zones 3, 7. Similar to the detection of animals, the control system 12 monitors the response from the induction coils 6 to look for a broadband dissipative response. When this is detected, the control system 12 sends control signals to the power source 10 to prevent or remove power being supplied to the primary coil 2, i.e. in the same manner as is described above.

Similarly, the power source continues to supply power to the induction coils 6 and the control system 12 continues to detect for a response from ferrous material. When the control system 12 determines that the ferrous material has been removed from the inner or outer zones 3, 7, the control system 12 sends control signals to the power source 10 to restore power to the primary coil 2, so that it may again generate the high power oscillating magnetic field to charge the battery in the electrically powered device.

It will be seen from the above that in at least preferred embodiments, the wireless power transfer system conveniently uses NQR to detect the presence of animals (through the detection of NQR induced in their biological material) that are exposed to the electromagnetic field generated by the induction coils, thus enabling the oscillating electromagnetic field generated by the primary coil to be stopped or reduced following the detection. This helps to prevent the animals from being exposed to the harmful non-ionising radiation from the oscillatory electromagnetic field generated by the primary coil.

The use of NQR to detect the biological material of animals is thus selective and specific to the target that is desired to be protected from the harmful non-ionising radiation from the oscillatory electromagnetic field generated by the primary coil. The detection system is therefore less likely to give false positives and more likely to give a faster response, a better position resolution, better reliability and/or cost effectiveness compared to alternative detection systems, e.g. PIR, LIDAR or radar.

Although the system described above with reference to FIGS. 1 and 2 is arranged to transfer power to an electrically powered device, e.g. to recharge its battery, it will be appreciated that the system may be arranged to transfer power in the opposite direction, e.g. from the electrically powered device to return power into the electricity grid.

The invention claimed is:

1. A wireless power transfer system comprising:
one or more primary coils for generating an oscillating electromagnetic field for wirelessly transferring power to one or more secondary coils;
one or more emitting coils arranged to generate an electromagnetic field for exciting a nuclear quadrupole resonance in the biological material of an animal exposed to the electromagnetic field generated by the one or more emitting coils; and
one or more detecting coils for detecting the absorption and/or emission of electromagnetic radiation by and/or from the excitation of the nuclear quadrupole resonance; or
one or more emitting and detecting coils arranged to generate an electromagnetic field for exciting a nuclear quadrupole resonance in the biological material of an animal exposed to the electromagnetic field and to detect the emission and/or absorption of electromagnetic radiation from and/or by the nuclear quadrupole resonance;
wherein the system is arranged, when the one or more detecting coils or the one or more emitting and detecting coils detect the absorption and/or emission of electromagnetic radiation by and/or from the excitation of the nuclear quadrupole resonance in the biological material of an animal, to prevent the one or more primary coils from generating, or to cause the one or more primary coils to reduce the amplitude of, the oscillating electromagnetic field.

2. The wireless power transfer system as claimed in claim 1, wherein the one or more primary coils are arranged to generate an oscillating electromagnetic field for transferring power wirelessly to an electrically powered device comprises the one or more secondary coils.

3. The wireless power transfer system as claimed in claim 2, wherein the electrically powered device is an electrically powered automotive vehicle.

4. The wireless power transfer system as claimed in claim 1, wherein the one or more emitting coils or the one or more emitting and detecting coils are arranged to generate an oscillatory magnetic field.

5. The wireless power transfer system as claimed in claim 1, wherein the one or more emitting coils or the one or more emitting and detecting coils are arranged to generate the electromagnetic field at a plurality of different frequencies.

6. The wireless power transfer system as claimed in claim 1, wherein the one or more emitting coils or the one or more emitting and detecting coils are arranged to generate an electromagnetic field having a frequency between 1 MHz and 100 MHz.

7. The wireless power transfer system as claimed in claim 1, wherein the electromagnetic field generated by the one or more emitting coils or the one or more emitting and detecting coils comprises a continuous wave and/or a pulsed electromagnetic field.

8. The wireless power transfer system as claimed in claim 1, wherein the one or more detecting coils or the one or more emitting and detecting coils comprise one or more induction coils arranged to detect a change in the impedance of the one or more induction coils caused by the absorption of electromagnetic radiation during excitation of the nuclear quadrupole resonance and/or wherein the one or more detecting coils or the one or more emitting and detecting coils comprise one or more induction coils arranged to detect an induced current in the one or more induction coils caused by the emission of electromagnetic radiation from the excitation of the nuclear quadrupole resonance.

9. The wireless power transfer system as claimed in claim 1, wherein the wireless power transfer system is arranged to perform time or frequency domain reflectometry using the electromagnetic radiation emitted by the nuclear quadrupole resonance.

10. The wireless power transfer system as claimed in claim 1, wherein the biological material comprises one or more amino acids and/or wherein the one or more emitting coils or the one or more emitting and detecting coils are arranged to generate an electromagnetic field for exciting a nuclear quadrupole resonance in nitrogen-14 in the biological material.

11. The wireless power transfer system as claimed in claim 1, wherein the one or more emitting coils or the one or more emitting and detecting coils are arranged to generate an electromagnetic field and the one or more detecting coils or the one or more emitting and detecting coils are arranged to detect the nuclear quadrupole resonance in a zone, such that nuclear quadrupole resonance is excited and detected in biological material of an animal that enters or passes through the zone.

12. The wireless power transfer system as claimed in claim 1, wherein the wireless power transfer system comprises an array of emitting coils and an array of detecting coils or an array of emitting and detecting coils surrounding the primary coil and/or wherein the wireless power transfer system comprises one or more tiles comprising the one or more emitting coils and/or the one or more detecting coils or the one or more emitting and detecting coils.

13. The wireless power transfer system as claimed in claim 1, wherein the wireless power transfer system comprises an array of detecting coils or an array of emitting and detecting coils, and wherein the wireless power transfer system is arranged to:

determine, using the array of detecting coils or the array of emitting and detecting coils, position information from the electromagnetic radiation detected by the array of detecting coils or the array of emitting and detecting coils;

determine, using the determined position information, when the position information exhibits a particular characteristic; and preventing the primary coil from generating or causing the primary coil to reduce the amplitude of the oscillating electromagnetic field when it is determined that the position information exhibits the particular characteristic.

14. The wireless power transfer system as claimed in claim 1, wherein the one or more detection coils or the one or more emitting and detecting coils are arranged to detect when there is no longer electromagnetic radiation being emitted from and/or absorbed by the biological material of an animal, and the wireless power transfer system is arranged to cause the primary coil to restore the oscillating electromagnetic field when the one or more detection coils or the one or more emitting and detecting coils have determined there is no longer electromagnetic radiation being emitted from and/or absorbed by the biological material of an animal.

15. The wireless power transfer system as claimed in claim 1, wherein the wireless power transfer system comprises a control system arranged to prevent the primary coil from generating or to cause the primary coil to reduce the amplitude of the oscillating electromagnetic field when the one or more detecting coils or the one or more emitting and detecting coils detect the absorption and/or emission of electromagnetic radiation by and/or from the nuclear quadrupole resonance excited in the biological material of an animal.

16. The wireless power transfer system as claimed in claim 15, wherein the control system is arranged to receive a control signal from the one or more detecting coils or the one or more emitting and detecting coils, when the one or more detecting coils or the one or more emitting and detecting coils detect the absorption and/or emission of electromagnetic radiation by and/or from the nuclear quadrupole resonance in the biological material of an animal, that triggers the control system to prevent the primary coil from generating or to cause the primary coil to reduce the amplitude of the oscillating electromagnetic field.

17. The wireless power transfer system as claimed in claim 1, wherein the one or more emitting coils and the one or more detecting coils or the one or more emitting and detecting coils are arranged to detect conductive material.

18. A method of operating a wireless power transfer system, the wireless power transfer system comprising:

one or more primary coils for generating an oscillating electromagnetic field for wirelessly transferring power to one or more secondary coils;

one or more emitting coils for generating an electromagnetic field for exciting a nuclear quadrupole resonance in the biological material of an animal exposed to the electromagnetic field generated by the one or more emitting coils; and one or more detecting coils for detecting the absorption and/or emission of electromagnetic radiation by and/or from the excitation of the nuclear quadrupole resonance, or one or more emitting and detecting coils arranged to generate an electromagnetic field for exciting a nuclear quadrupole resonance in the biological material of an animal exposed to the electromagnetic field and to detect the emission and/or absorption of electromagnetic radiation from and/or by the nuclear quadrupole resonance;

wherein the method comprises:

generating an electromagnetic field, using the one or more emitting coils or the one or more emitting and detecting coils, for exciting a nuclear quadrupole resonance in the biological material of an animal exposed to the electromagnetic field;

detecting the absorption and/or emission of electromagnetic radiation, using the one or more detecting coils or the one or more emitting and detecting coils, by and/or from the excitation of the nuclear quadrupole resonance; and preventing the one or more primary coils from generating, or causing the one or more primary coils to reduce the amplitude of, the oscillating electromagnetic field when the one or more detecting coils or the one or more emitting and detecting coils detect the absorption and/or emission of electromagnetic radiation by and/or from the excitation of the nuclear quadrupole resonance in the biological material of an animal.

\* \* \* \* \*